(12) United States Patent
Hoffman et al.

(10) Patent No.: US 6,350,425 B2
(45) Date of Patent: *Feb. 26, 2002

(54) ON-SITE GENERATION OF ULTRA-HIGH-PURITY BUFFERED-HF AND AMMONIUM FLUORIDE

(75) Inventors: Joe G. Hoffman, Cardiff; R. Scot Clark, Fallbrook, both of CA (US)

(73) Assignee: Air Liquide America Corporation, Houston, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/881,747

(22) Filed: Jun. 24, 1997

Related U.S. Application Data (63) Continuation-in-part of application No. 08/674,130, filed on Jul. 1, 1996, now Pat. No. 5,722,442, which is a continuation-in-part of application No. 08/610,261, filed on Mar. 4, 1996, now Pat. No. 5,755,934, which is a continuation-in-part of application No. 08/179,001, filed on Jan. 7, 1994, now Pat. No. 5,496,778, which is a continuation-in-part of application No. PCT/US96/10388, filed on Jun. 5, 1996, which is a continuation-in-part of application No. PCT/US95/07649, filed on Jun. 5, 1995.

(60) Provisional application No. 60/018,104, filed on Jul. 7, 1995.

(51) Int. Cl.[7] .............................. C01C 1/16; C01B 7/19
(52) U.S. Cl. ...................... 423/470; 423/471; 423/483; 423/484; 423/488
(58) Field of Search .................. 423/470, 471, 423/484, 488, 413, 483, 462, 352

(56) References Cited

U.S. PATENT DOCUMENTS 3,725,536 A * 4/1973 Gentilli ...................... 423/485
4,000,251 A * 12/1976 Briska et al. ............... 423/471
4,756,899 A    7/1988 Jenczewski et al. ........ 423/483

(List continued on next page.)

FOREIGN PATENT DOCUMENTS

| DE | 281173 | * 8/1990 | ................. 423/470 |
| EP | 0 276 542 | 6/1987 | |
| EP | 0 351 107 | 1/1990 | |
| FR | 1596497 | 6/1970 | |
| JP | 61-6121 | * 1/1986 | ................. 423/470 |
| JP | 61-151002 | 7/1987 | |
| JP | 62213127 | 9/1987 | |
| JP | 63152603 | 6/1988 | |
| JP | 63283027 | 11/1988 | |
| JP | 6434407 | 2/1989 | |
| RU | 379533 | 4/1973 | |
| RU | 979271 | 12/1982 | |
| SU | 1326552 | * 7/1987 | ................. 423/470 |

OTHER PUBLICATIONS

G.A. Blyum et al, "Use of Radioactive Isotopes to Study Liquid–Vapor Equilibrium in Binary Systems Formed by Hydrofluoric Acid with Microimpurities of Some Elements," Article No. 81:177347; No date.

M.I. Kafyrov et al, "Extra Pure Hydrofluoric Acid," Article No. 74:101216; No date.

I.I. Angelov et al, "Preparation of Especially Pure Hydrofluoric Acid," Article No. 78:23343; No date.

(List continued on next page.)

*Primary Examiner*—Ngoc-Yen Nguyen
(74) *Attorney, Agent, or Firm*—Burns, Doane, Swecker & Mathis, L.L.P.

(57) ABSTRACT

Provided is a novel method and system for preparing ultra-high-purity buffered-hydrofluoric acid or ammonium fluoride controlled concentration The method comprises bubbling purified ammonia vapor into ultra-pure hydrofluoric acid. The inventive method and system can be used as an on-site subsystem in a semiconductor device fabrication facility for supplying the buffered-hydrofluoric acid and ammonium fluoride to points of use in the semiconductor device fabrication facility.

25 Claims, 4 Drawing Sheets

U.S. PATENT DOCUMENTS

| | | | | |
|---|---|---|---|---|
| 4,795,582 A | * | 1/1989 | Ohmi et al. | 252/79.3 |
| 4,828,660 A | | 5/1989 | Clark et al. | 423/531 |
| 4,929,435 A | | 5/1990 | Boghean et al. | 423/484 |
| 4,952,386 A | | 8/1990 | Davison et al. | 423/484 |
| 4,954,330 A | | 9/1990 | Ziegenhain | 423/484 |
| 4,980,032 A | | 12/1990 | Dobson et al. | 203/40 |
| 5,047,226 A | | 9/1991 | Schon | 423/484 |
| 5,108,559 A | * | 4/1992 | Motz et al. | 423/484 |
| 5,164,049 A | | 11/1992 | Clark et al. | 203/40 |
| 5,235,235 A | * | 8/1993 | Martin et al. | 310/313 D |
| 5,242,468 A | | 9/1993 | Clark et al. | |
| 5,288,333 A | | 2/1994 | Tanaka et al. | 134/31 |
| 5,318,706 A | * | 6/1994 | Ohmi et al. | 210/649 |
| 5,346,557 A | | 9/1994 | Ito et al. | 134/10 |
| 5,348,722 A | * | 9/1994 | Shimono et al. | 423/484 |
| 5,362,469 A | | 11/1994 | Seseke-Koyro et al. | 423/484 |
| 5,437,710 A | | 8/1995 | Grant et al. | |
| 5,458,756 A | * | 10/1995 | Bassons et al. | 204/224 R |
| 5,496,778 A | | 3/1996 | Hoffman et al. | 423/352 |
| 5,500,098 A | | 3/1996 | Brown et al. | 203/13 |
| 5,533,402 A | * | 7/1996 | Sarvazyan et al. | 73/645 |
| 5,632,866 A | * | 5/1997 | Grant | 203/12 |
| 5,785,820 A | * | 7/1998 | Hoffman et al. | 423/484 |

OTHER PUBLICATIONS

G.Z. Blyum et al, "Liquid–Vapor Equilibrium in a System Formed by Hydrofluoric acid and Arsenic or Phosphorus Microimpurity in the Presence of Potassium Permanganate," Article No. 81:177348 No date.

N.I. Varlamova et al, "Purifying Hydrofluoric Acid," Article No. 98:200672, No date.

* cited by examiner

ON-SITE GENERATION OF ULTRA-HIGH-PURITY BUFFERED-HF AND AMMONIUM FLUORIDE

CROSS REFERENCE TO RELATED APPLICATIONS

This application is a continuation-in-part of application Ser. No. 08/674,130, filed Jul. 1, 1996, now U.S. Pat. No. 5,722,442 which is a continuation-in-part of application Ser. No. 08/610,261, filed Mar. 4, 1996, now U.S. Pat. No. 5,755,934, which is a continuation of application Ser. No. 08/179,001, filed Jan. 7, 1994, now U.S. Pat. No. 5,496,778. This application is also a continuation-in-part of PCT application Nos. PCT/US96/10388, filed Jun. 5, 1996, and of PCT/US95/07649, filed Jun. 5, 1995. The present application also claims benefit of priority through Ser. No. 08/674,130 of U.S. Provisional Application Ser. No. 60/018,104, filed Jul. 7, 1995.

BACKGROUND OF THE INVENTION

1. Field of the Invention

The present invention relates to a method and system for producing ultra-high-purity buffered-hydrofluoric acid (buffered-HF or BHF) or ultra-high-purity ammonium fluoride ($NH_4F$). The invention has particular applicability in semiconductor fabrication for providing ultra-high-purity materials to a semiconductor manufacturing operation.

2. Description of the Related Art a. Contamination Control

Contamination is generally an overwhelmingly important concern in integrated circuit (IC) manufacturing. A large fraction of the steps used in modern integrated circuit manufacturing are cleanup steps of one kind or another. Such cleanup steps are used, for example, to remove organic contaminants, metallic contaminants, photoresist (or inorganic residues thereof), byproducts of etching, native oxides, etc.

The cost of a new IC wafer fabrication facility is typically more than one billion dollars ($1,000,000,000). A large fraction of the cost for such facilities is directed to measures for particulate control, cleanup, and contamination control.

One important and basic source of contamination in semiconductor fabrication is impurities in the process chemicals. Since the cleanup steps are performed so frequently in and are so critical to IC fabrication, contamination due to cleanup chemistry is very undesirable.

b. Wet Versus Dry Processing

One of the long-running technological shifts in semiconductor processing has been the changes (and attempted changes) between dry and wet processing. In dry processing, only gaseous or plasma-phase reactants come in contact with the wafer or wafers being treated. In wet processing, a variety of liquid reagents are used for a multitude of purposes, such as the etching of silicon dioxide, silicon nitride and silicon, and the removal of native oxide layers, organic materials, trace organic or inorganic contaminants and metals.

While plasma etching has many attractive capabilities, it is not adequate for use in cleanup processes. There is simply no available chemistry with plasma etching to remove some of the most undesirable impurities, such as gold. Thus, wet cleanup processes are essential to modern semiconductor processing, and are likely to remain so for the foreseeable future.

Plasma etching is performed using a photoresist mask in place, and is not immediately followed by high-temperature processes. After plasma etching, the resist is stripped from the wafer surface using, for example, an $O_2$ plasma treatment. Cleanup of the resist stripped wafer(s) is then necessary.

The materials which the cleanup process should remove include, for example, photoresist residues (organic polymers), sodium, alkaline earth metals (e.g., calcium, magnesium) and heavy metals (e.g., gold). Many of these contaminants do not form volatile halides. As a result, plasma etching will not remove such contaminants from the wafer surface. Hence, cleanup processes using wet chemistries are required.

Because any dangerous contaminants stemming from the plasma etching process are removed prior to high-temperature processing steps by wet chemical treatment, the purities of plasma etching process chemicals (i.e., liquified or compressed gases) are not as critical as those of the liquid chemicals used in cleanup processes. This difference is due to the impingement rate of the liquid chemical at the semiconductor surface typically being one million times greater than that of the plasma species in plasma etching. Moreover, since the liquid cleanup steps are directly followed by high-temperature processes, contaminants on the wafer surface tend to be driven (i.e., diffused) into the wafer.

Wet processing has a major drawback insofar as ionic contamination is concerned. Integrated circuit devices generally use only a few dopant species (e.g., boron, arsenic, phosphorus, and antimony) to form the requisite p-type and n-type doped regions of the device. However, many other species act as electrically active dopants, and are highly undesirable contaminants. These contaminants can have deleterious effects on the IC devices, such as increased junction leakage at concentrations well below $10^{13}$ cm$^{-3}$.

Moreover, some less desirable contaminants segregate into the silicon substrate. This occurs when silicon is in contact with an aqueous solution, and the equilibrium concentration of the contaminants is higher in the silicon than in the solution. Moreover, some less desirable contaminants have very high diffusion coefficients. Consequently, introduction of such contaminants into any part of the silicon wafer may result in diffusion of the contaminants throughout the wafer, including junction locations where leakage may result.

Thus, liquid solutions for treating semiconductor wafers should have extremely low levels of metal ions. Preferably, the concentration of all metals combined should be less than 300 ppt (parts per trillion), and less than 10 ppt for any single metal. Even lower concentrations are desirable. Contamination by anions and cations should also be controlled. Some anions may have adverse effects, such as complexed metal ions which reduce to mobile metal atoms or ions in the silicon lattice.

Front end facilities typically include on-site purification systems for preparation of high-purity water (i.e., "deionized" or "DI" water). However, it is more difficult to obtain liquid process chemicals in the purities required.

c. Purity in Semiconductor Manufacturing

Undetected contamination of chemicals increases the probability for costly damage to a large quantity of wafers. The extreme purity levels required by semiconductor manufacturing are rare and unique among industrial processes. With such extreme purity requirements, handling of chemicals is undesirable (though of course it cannot be entirely avoided). Exposure of ultrapure chemicals to air (particularly in an environment where workers are also present) should be minimized. Such exposure risks the introduction of particulates into the chemicals, which can result in the contamination of those chemicals. Furthermore, shipment of ultrapure chemicals in closed containers is not ideal, since such containers increase the risk of contaminants being generated at the manufacturer's or at the user's site.

Since many corrosive and/or toxic chemicals are used in semiconductor processing, the reagent supply locations are commonly separated from the locations where front-end workers are present. Most gases and liquids can be transported to wafer fabrication stations from anywhere in the same building (or in the same site).

d. Uses of Buffered-HF and Ammonium Fluoride in Semiconductor Processing

One of the important chemicals in the electronics industry is hydrofluoric acid (aqueous HF). Hydrofluoric acid solutions are used as cleaning and etching agents for silicon wafers, circuit boards and high speed, high density chips for computers and optics. In semiconductor manufacturing, those materials are very important for deglazing (i.e., removal of thin native oxides) and for oxide removal generally.

The reaction of HF with silicon produces fluosilicilic acid, a strong acid which shifts the pH of the etching solution and hence the etch rate. As a result, hydrofluoric acid is often used in buffered form (Buffered-HF or BHF), to reduce shifts in pH as the acid solution becomes loaded with etching by-products. In buffered-hydrofluoric acid, the buffering in the acid solution is usually provided by an ammonium component, such as ammonium fluoride ($NH_4F$) Ammonium fluoride and buffered-HF differ in their respective $NH_3$ to HF molar ratios. Ammonium fluoride solutions have a $NH_3$ to HF molar ratio of 1.00, whereas buffered-HF solutions have a molar excess of HF.

Buffered-HF solutions are identified by the ratio in volume parts of 40% ammonium fluoride to 49% HF. Thus, a 50:1 BHF solution consists of 50 parts by volume 40% ammonium fluoride to 1 part by volume 49% HF. Typical BHF solutions used in the semiconductor processing industry are 10:1, 50:1 and 200:1, although other ratios are also used.

The requirement for buffering with ultra-high-purity chemicals presents further problems, since the buffering agent too is a source of contaminants, and must be sufficiently pure so as not to degrade the cleaning or etching system.

e. Objects and Advantages of the Invention

To meet the requirements of the semiconductor processing industry and to overcome the disadvantages of the related art, it is an object of the present invention to provide novel methods and systems for the preparation of ultra-high-purity buffered-hydrofluoric acid and ultra-high-purity ammonium fluoride in which the hydrofluoric acid and ammonium fluoride can be formed at or introduced directly to a point of use. The system is very compact, and can be located in the same building as the point of use (or in an adjacent building), so that chemical handling can be avoided. As a result, low impurity levels on a semiconductor wafer surface can be achieved, resulting in better device characteristics and increased product yield.

SUMMARY OF THE INVENTION

The foregoing objectives are met by the methods and systems of the present invention. According to a first aspect of the present invention, a novel method for preparing ultra-high-purity buffered-hydrofluoric acid or ultra-high-purity ammonium fluoride of controlled concentration is provided. The method comprises bubbling purified ammonia vapor into ultra-pure hydrofluoric acid.

According to a second aspect of the invention, a system for preparing the ultra-high-purity buffered-hydrofluoric acid or ammonium fluoride of controlled concentration is provided. The system comprises a source of purified ammonia vapor, a source of ultrapure hydrofluoric acid and a generator which combines the ammonia vapor with the ultra-pure hydrofluoric acid to produce the ultra-high-purity buffered-hydrofluoric acid or ammonium fluoride.

The inventive system and method can be applied to an on-site subsystem, in a semiconductor device fabrication facility for supplying the buffered-HF or ammonium fluoride to points of use therein.

BRIEF DESCRIPTION OF THE DRAWINGS

The objects and advantages of the invention will become apparent from the following detailed description of the preferred embodiments thereof in connection with the accompanying drawings, in which like reference numerals designate like elements, and in which.

DETAILED DESCRIPTION OF THE PREFERRED EMBODIMENTS OF THE INVENTION

The inventors have found methods and systems for the preparation of ultra-high-purity buffered-hydrofluoric acid (buffered-HF) or ultra-high-purity ammonium fluoride ($NH_4F$) which have particular applicability in the semiconductor manufacturing industry. In particular, the ultrapure chemicals can be generated on-site, for example, at a semiconductor manufacturing facility, so that they can be piped directly to or generated directly at points of use. The disclosed systems are very compact units which can be located in the same building as a front end (or in an adjacent building), so that handling of the chemicals is avoided.

The purities of the buffered-HF and ammonium fluoride starting materials, ammonia and HF, are important to the final product purity. Purification methods and systems for those materials are described below.

On-Site Purification of $NH_3$

In accordance with this invention, provided are methods and systems for preparing ultra-high-purity ammonia which can be used as a starting material in the manufacture of buffered-HF. The system is an on-site system which can be located at a semiconductor wafer production site.

Figure 1:
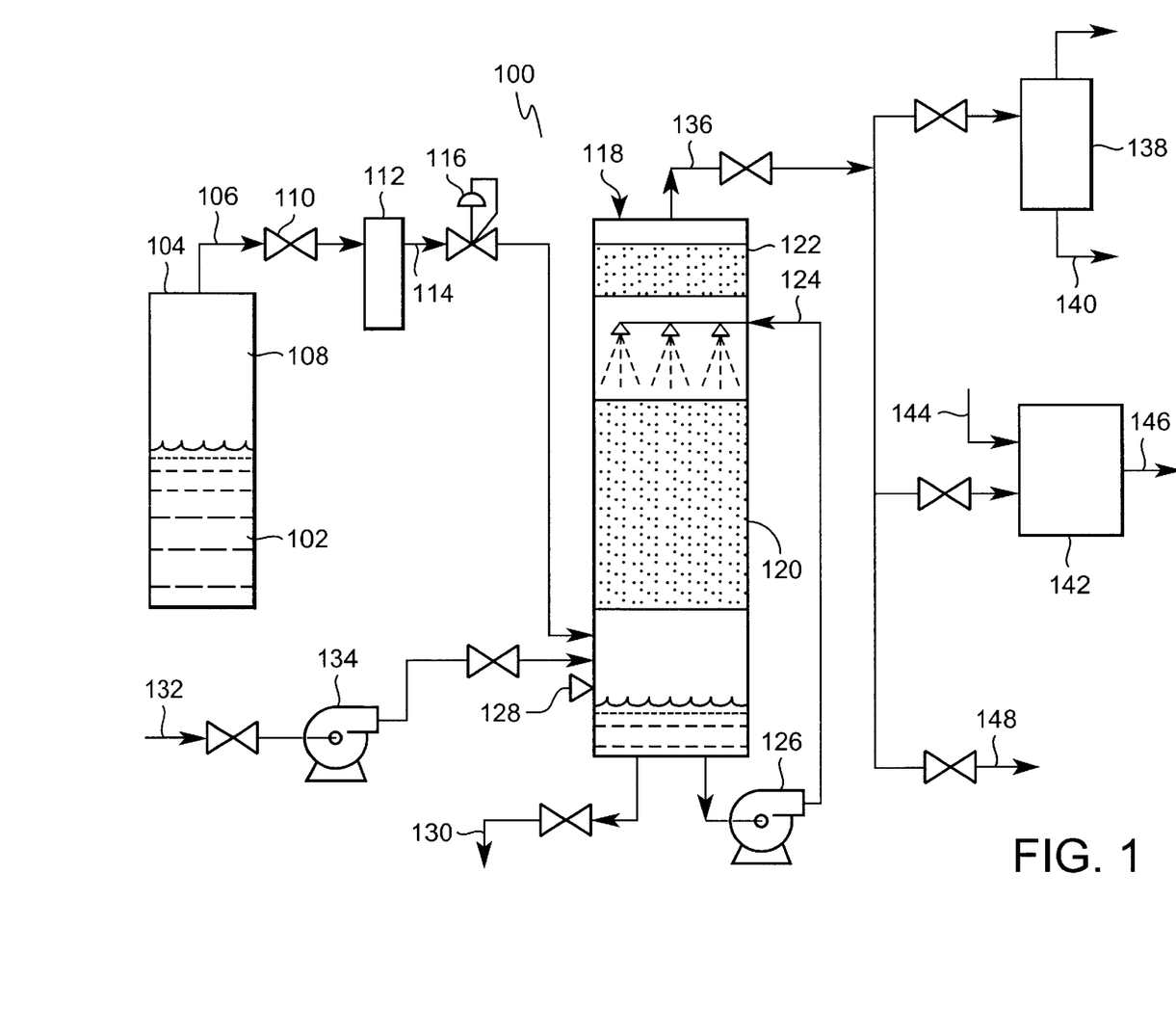
FIG. 1 is a process flow diagram of a unit for the production of ultrapure ammonia.

A process flow diagram depicting one example of an ammonia purification unit 100 in accordance with this invention is shown in FIG. 1. Liquid ammonia 102 is stored in a reservoir 104 which acts as an evaporation source for ammonia vapor 106. Ammonia vapor 106 is drawn from the vapor space 108 in the reservoir. Drawing vapor in this manner serves as a single-stage distillation, leaving certain solid and high-boiling impurities behind in the liquid phase. The supply reservoir can be any conventional supply tank or other reservoir suitable for containing ammonia, and the ammonia can be in anhydrous form or an aqueous solution.

The reservoir can be maintained at atmospheric pressure or at a pressure above atmospheric if desired to enhance the flow of the ammonia through the system. The reservoir is preferably heat controlled, so that the temperature is within the range of from about 10° to about 50° C., preferably from about 15° to about 35° C., and most preferably from about 20° to about 25° C.

Impurities that will be removed as a result of drawing the ammonia from the vapor phase include, for example, the following: Metals of Groups I and II of the Periodic Table, as well as aminated forms of these metals which form as a result of the contact with ammonia; oxides and carbonates of these metals, as well as hydrides such as beryllium hydride and magnesium hydride; Group III elements and their oxides, as well as ammonium adducts of hydrides and halides of these elements; transition metal hydrides; and heavy hydrocarbons and halocarbons, such as pump oil.

The ammonia drawn from reservoir 104 is passed through a shut-off valve 110 and through filtration unit 112 which can remove any solid matter entrained with the vapor. Microfiltration and ultrafiltration units and membranes are commercially available and can be used for this purpose. The grade and type of filter can be selected according to need. The presently preferred embodiment uses a gross filter, followed by a 0.1 micron filter, in front of an ionic purifier 118, and no filtration after the ionic purifier.

The filtered ammonia vapor 114, the flow of which is controlled by pressure regulator 116, is directed to an ionic purifier 118, which preferably takes the form of a scrubber unit. In the exemplary ionic purifier, scrubbing column 118 contains a packed section 120 and a mist removal pad 122.

Saturated aqueous ammonia 124 flows downward as the ammonia vapor flows upward, the liquid being circulated by a circulation pump 126, and the liquid level being controlled by a level sensor 128. Waste 130 is drawn off periodically from the retained liquid in the bottom of the scrubber. Deionized water 132 is supplied to scrubber 118, with an elevated pressure being maintained by a pump 134.

The vapor is scrubbed with high-pH purified (preferably deionized) water. The high-pH water is preferably an aqueous ammonia solution, with the concentration raised to saturation by recycling through the scrubber. The scrubber can be conveniently operated as a conventional scrubbing column in countercurrent fashion.

Although the operating temperature is not critical, the column is preferably run at a temperature ranging from about 10° to about 50° C., preferably from about 15° to about 35° C.

Likewise, the operating pressure is not critical, although preferred operation is at a pressure of from about atmospheric pressure to about 30 psi above atmospheric. The column typically contains a conventional column packing to provide for a high degree of contact between liquid and gas, and preferably a mist removal section as well.

In one presently preferred example, the column has a packed height of approximately 3 feet (0.9 meter) and an internal diameter of approximately 7 inches (18 cm), to achieve a packing volume of 0.84 cubic feet (24 liters). The column of the preferred example is operated at a pressure drop of about 0.3 inches of water (0.075 kPa) and less than 10% flood, with a recirculation flow of about 2.5 gallons per minute (0.16 liter per second) nominal or 5 gallons per minute (0.32 liter per second) at 20% flood, with the gas inlet below the packing, and the liquid inlet above the packing but below the mist removal section.

Preferred packing materials for a column of this description are those which have a nominal dimension of less than one-eighth of the column diameter. The mist removal section of the column will have a similar or a more dense packing, and is otherwise conventional in construction. It should be understood that all descriptions and dimensions with respect to the preferred embodiment are exemplary only. Each of the system parameters may be varied.

In typical operation, startup is achieved by first saturating deionized water with ammonia to form a solution for use as the starting scrubbing medium. During operation of the scrubber, a small amount of liquid in the column sump is drained periodically to remove accumulated impurities.

Examples of impurities that will be removed by the scrubber include reactive volatiles such as silane ($SiH_4$) and arsine ($AsH_3$); halides and hydrides of phosphorus, arsenic and antimony; transition metal halides in general; and Group III and Group VI metal halides and hydrides.

The units described up to this point may be operated in either batchwise, continuous or semi-continuous manner. Continuous or semi-continuous operation is preferred. The volumetric processing rate of the ammonia purification system is not critical and may vary widely. In most operations, however, the flow rate of ammonia through the system is preferably within the range of from about 200 $cm^3/h$ to thousands of liters per hour.

The scrubbed ammonia 136 can be directed to one of three alternate routes, including: (1) a distillation column 138 where the ammonia is further purified, the resulting distilled ammonia 140 then being directed to the point(s) of use; (2) a dissolving unit 142 where the ammonia is combined with deionized water 144 to form an aqueous solution 146, which is directed to a point of use. For plant operations with multiple points of use, the aqueous solution can be collected in a holding tank from which the ammonia is drawn into individual lines for a multitude of point-of-use destinations at the same plant; and (3) a transfer line 148 which carries the ammonia in gaseous form to a point of use.

The second and third of these alternatives, which do not utilize the distillation column 138, are suitable for producing ammonia with less than 100 parts per trillion of any metallic impurity. For certain uses, however, the inclusion of the distillation column 138 is preferred. Examples are furnace or chemical vapor deposition (CVD) uses of the ammonia. If the ammonia is used for CVD, for example, the distillation column would remove non-condensables, such as oxygen and nitrogen, which might interfere with the CVD process. In addition, since the ammonia leaving the scrubber 118 is saturated with water, a dehydration unit can optionally be incorporated into the system between the scrubber 118 and the distillation column 138, depending on the characteristics and efficiency of the distillation column.

With any of these alternatives, the resulting stream, be it gaseous ammonia or an aqueous solution, can be divided into two or more branch streams, each directed to a different use station. The purification unit can thereby supply purified ammonia to a number of use stations simultaneously.

In the presently preferred embodiment, the liquid volume of the ammonia purifier is 10 l, and the maximum gas flow rate is about 10 standard l/min. The scrubbing liquid is purged, continuously or incrementally, such that it turns over at least once in 24 hours.

In a batch operation, a typical operating pressure can be 300 psia (2,068 kPa), with a batch size of 100 pounds (45.4 kg). The column in this example has a diameter of 8 inches (20 cm), a height of 72 inches (183 cm), operating at 30% of flood, with a vapor velocity of 0.00221 feet per second (0.00067 meter per second), a height equivalent to a theoretical plate of 1.5 inches (3.8 cm) and 48 equivalent plates.

The boiler size in this example is about 18 inches (45.7 cm) in diameter and 27 inches (68.6 cm) in length, with a reflux ratio of 0.5. Recirculating chilled water enters at 60° F. (15.6° C.) and leaves at 90° F. (32.2° C.). Again, the above is merely exemplary, and distillation columns varying widely in construction and operational parameters can be used.

Depending on its use, the purified ammonia, either with or without the distillation step, can be used as a purified gas or as an aqueous solution. In the latter case, the purified ammonia is dissolved in purified (preferably deionized) water. The proportions and the means of mixing are conventional.

On-Site HF Purification and Vaporization

Anhydrous HF is typically manufactured by the addition of sulfuric acid to fluorspar, $CaF_2$. Unfortunately, many fluorspars contain arsenic, which leads to contamination of the resulting HF. Other impurities, in conventional systems, are contributed by the HF generation and handling system. These impurities result from degradation of these systems, since they were designed for applications much less demanding than the semiconductor industry. These contaminants must be removed in order to achieve good semiconductor performance.

Figure 2:
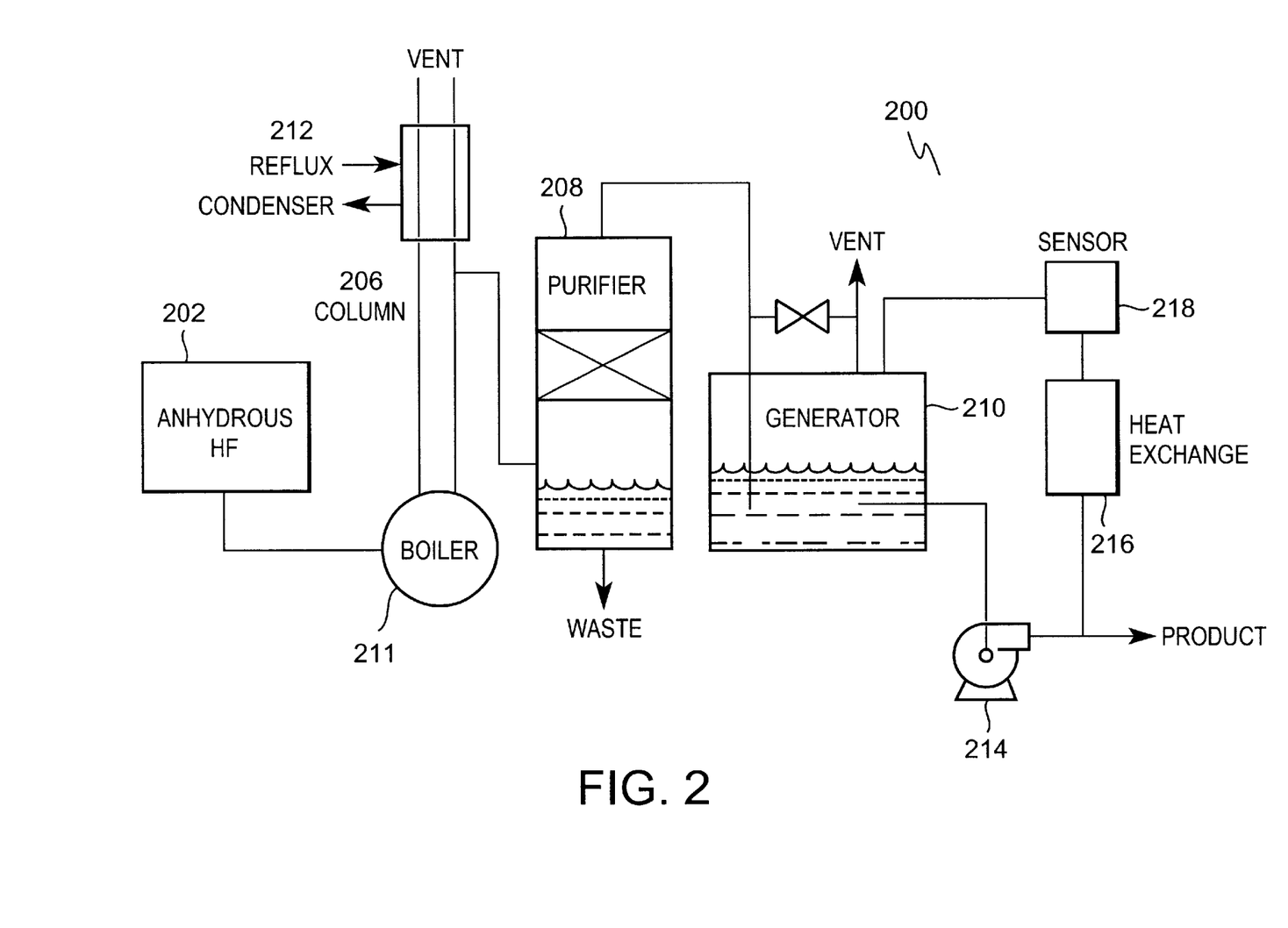
FIG. 2 illustrates an on-site hydrofluoric acid generator.

FIG. 2 illustrates an on-site purification process flow and system 200 for preparing ultra-high-purity HF which can be used as a starting material in the manufacture of buffered-HF. The HF process flow includes a batch process arsenic removal and evaporation stage 202, a fractionating column 206 to remove most other impurities, an ionic purifier column 208 to suppress contaminants not removed by the fractionating column, and a generator or supplier 210.

Arsenic is converted to the +5 state and held in the evaporator 202 during distillation by the addition of an oxidant ($KMnO_4$ or $(NH_4)_2S_2O_8$) and a cation source such as $KHF_2$ to form the salt $K_2AsF_7$. This should be a batch process, as the reaction is slow and sufficient time for completion must be allowed before the distillation takes place. This process typically requires contact times of approximately one hour at nominal temperatures. To achieve complete reaction in a continuous process would require high temperatures and pressures (which are undesirable from a safety standpoint) of very large vessels and piping. HF is introduced into a batch process evaporator vessel 202 and is treated with the oxidant while stirring for a suitable reaction time. The arsenic in the HF is oxidized into the +5 oxidation state and fractionation is performed to remove the $As^{+5}$ and metallic impurities. See, U.S. Pat. No. 4,929,435, which is herein incorporated by reference.

A variety of oxidizing reagents have been used for this purpose, as shown in the literature. See e.g., U.S. Pat. Nos. 3,685,370, 5,047,226, 4,954,330, 4,955,430, 4,083,441; Canadian Patent Document Nos. CA 81-177347, CA 74-101216, CA 78-23343, CA 81-177348t, CA98-P200672f; European Patent Document Nos. EP 351,107, EP 276,542; Japanese Patent Document No. JP 61-151002; and U.S.S.R. Patent Document No. 379,533, all of which are herein incorporated by reference.

Fluorine ($F_2$) has been shown to work by the published work of others, and is regarded as a preferred embodiment. Fluorine requires expensive plumbing and safeguards, but has been shown to be workable. An alternative preferred embodiment uses ammonium persulfate ($(NH_4)_2S_2O_8$), which is conveniently available in ultra-high purity. In general, oxidizers which do not introduce metal atoms are preferred. Thus other candidates include $H_2O_2$ and $O_3$.

A less preferred candidate is Caro's acid (persulfuric acid, $H_2SO_5$, which produces $H_2O_2$ in solution). Another option is $ClO_2$, but this has the severe disadvantage of being explosive. Other options include $HNO_3$ and $Cl_2$, but both of these introduce anions which must be separated out. The reduction of non-metallic anions is not as critical as the reduction of metal cations, but it is still desirable to achieve anion levels of 1 ppb or less. The initial introduction of anions thus adds to the load on the ionic purification stage. $KMnO_4$ is a conventional oxidant, and is predicted to be useable for ultrapurification if followed by the disclosed ionic purifier and HF stripping process. However, this reagent imposes a substantial burden of cations on the purifier, so a metal-free oxidizer is preferred.

In an alternative embodiment, high-purity hydrofluoric acid, for example 49% HF, which is essentially arsenic-free can be used as a starting material. Such low-arsenic material can be used in combination with an on-site ionic purification process without the need for an arsenic oxidation step, to produce ultrapure HF on-site. In this case, the arsenic removal step can be omitted.

The HF is then distilled in fractionating column 206 to remove the bulk of the metallic impurities therefrom. Fractionating column 206 acts as a series of many simple distillations. This is achieved by packing the column with a high surface area material with a counter-current liquid flow, thus ensuring complete equilibrium between the descending liquid and the rising vapor. Column 206 includes a reboiler 211 and a partial condenser 212 provides reflux. Elements showing significant reduction at this step include the following:

| | |
|---|---|
| Group 1 (I) | Na |
| Group 2 (II) | Ca, Sr, Ba |
| Groups 3–12 (IIIA–IIA) | Cr, W, Mo, Mn, Fe, Cu, Zn |
| Group 13 (III) | Ga |
| Group 14 (IV) | Sn, Pb |
| Group 15 (VII) | Sb. |

The purified gaseous HF is then conducted to HF ionic purifier 208. The HF prior to treatment in the ionic purifier is pure by normal standards, except for the possible carry-over of the arsenic treatment chemicals or the quench required to remove these chemicals.

The HF ionic purifier is utilized as an additional purity guarantee prior to introduction of the HF gas into the supplier system 210. Certain elements may be present in the treatment solution or introduced into the ionic purifier to absorb sulfate carried over in the HF stream. Ionic purifier testing has demonstrated significant reductions in the HF gas stream contamination for these elements:

| | |
|---|---|
| Group 2 (II) | Sr, Ba |
| Groups 6–12 (VIA–IIA) | Cr, W, Cu |
| Group 13 (III) | B |
| Group 14 (IV) | Pb, Sn |
| Group 15 (V) | Sb. |

Many of the above elements are useful in suppressing the arsenic contamination. Any carryover in the distillation column arising from their excess in the arsenic treatment can be rectified at this step.

The HF, once introduced into generator 210, can be mixed with deionized water to provide an HF solution of desired concentration. During mixing, the solution in generator is continuously removed and transported by pump 214 through heat exchanger 216 to remove the heat of reaction therefrom.

After the solution passes through heat exchanger 216, the concentration thereof is monitored by sensor 218, which allows for accurate chemical blending. Suitable generators, sensors, heat exchangers and other components are described below with reference to the buffered-HF generator system.

On-Site Preparation of Ultrapure Buffered-HF and Ammonium Fluoride

The methods for generating buffered-HF and those for generating ammonium fluoride ($NH_4F$) in accordance with the invention differ only in their respective $NH_3$ to HF molar ratios. As a result, the same systems can be used in preparing both types of solutions, the only difference being in concentration set points to achieve the desired molar ratios. Thus, to obtain ammonium fluoride solutions, the set point would be set such that the $NH_3$ to HF molar ratio is 1.00, while a molar excess of HF would be used to prepare buffered-HF solutions.

Figure 3:
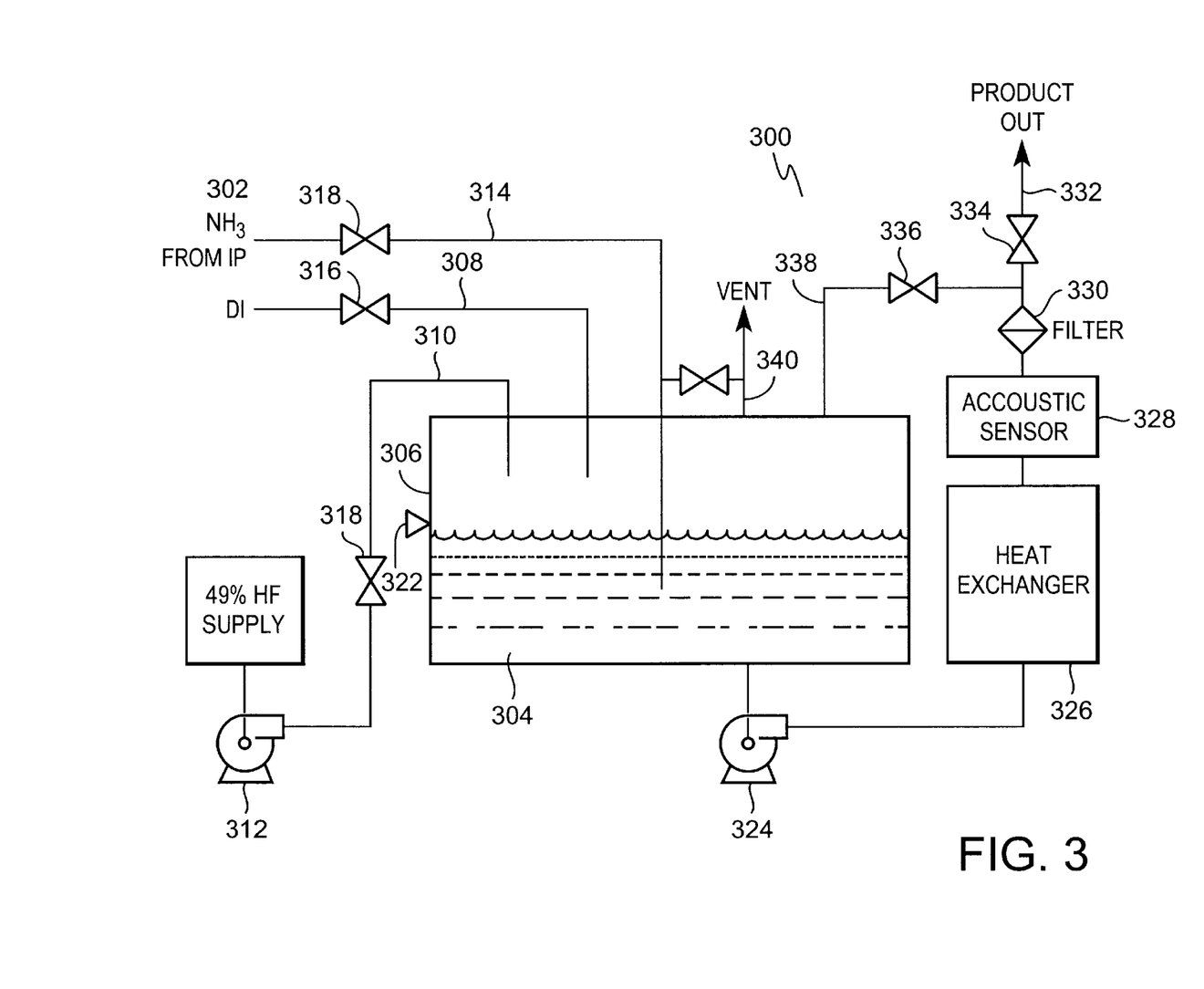
FIG. 3 is a process flow diagram of a unit for producing buffered-hydrofluoric acid in accordance with the invention.

On-site generation of buffered-HF and ammonium fluoride will be described with reference to FIG. 3, which illustrates an exemplary unit 300 and process flow for generating buffered-HF in accordance with the invention.

According to one aspect of the invention, the buffered-HF or ammonium fluoride can be prepared by bubbling ammonia vapor 302 into a hydrofluoric acid solution 304. The piping for transporting the chemicals or gases, as well as other wetted surfaces of the system should be constructed of materials which are compatible with the chemicals or gases being contacted to avoid or minimize contamination. Suitable materials include, for example, polyfluorinated polymers such as Teflon® (tetrafluoroethylene), polyfluoroethane (PFA) and polyfluoroethylene (PFE).

The buffered-HF/ammonium fluoride generation unit 300 includes a mixing tank 306 in which the starting materials are mixed. In an exemplary embodiment, mixing tank 306 is a 20 gallon Teflon® tank. In addition to Teflon®, suitable materials of construction for the mixing tank include but are not limited to polyvinyldifluoroethylene (PVDF) and polyethylene.

While the mixing tank preferably has a volume of from about 1 to 20 gallons, the present invention can easily be applied to substantially smaller (e.g., on the order of a few cubic centimeters) or larger (e.g., on the order of several thousand gallons) volumes.

The buffered-HF/ammonium fluoride generation unit 300 includes a high-purity deionized (DI) water supply line 308 for feeding high-purity water into mixing tank 306. HF is fed through supply line 310 into mixing tank 306. Transport of the HF into the mixing tank is accomplished with the assistance of pump 312. Suitable types of pumps are known in the art and include, for example, double diaphragm pumps, centrifugal pumps and metering pumps, the fluid contacting portions of which should be constructed of a non-contaminating material, such as Teflon®. Suitable pumps are commercially available from White Knight Corporation.

Ultra-high-purity ammonia gas is fed into mixing tank 306 via supply line 314. The ammonia can be fed directly from the ionic purifier (including any subsequent processing) as described above in reference to the ammonia purification unit, or an other ultra-high-purity ammonia source. Each of the DI water, HF and $NH_3$ supply lines 308, 310 and 314 include a valve 316, 318 and 320, respectively, for regulating the amount of those materials introduced into the mixing tank.

To roughly monitor the amount of chemicals introduced into mixing tank 306, a first level sensor 322 is provided. Suitable level sensors are known in the art and include, for example, infrared (IR) or capacitance level sensors. Alternatively, any suitable volumetric or gravimetric scale can be used.

During chemical mixing (including ammonia bubbling), the solution in mixing tank 306 is continuously removed and transported by pump 324 through heat exchanger 326 to remove the heat of reaction therefrom. Suitable heat exchangers include, for example, shell and tube, plate and frame, and jacket and tube-type heat exchangers. The heat exchanger is preferably formed of a material which allows for sufficient heat transfer and which does not add contamination to the product chemical. Suitable materials of construction for the heat exchanger include, for example, Teflon®, PVDF, PFA and polyethylene.

After the solution passes through heat exchanger 326, the concentration thereof is monitored by sensor 328. Sensor 328 allows for proper chemical blending during each chemical or gas addition step to be achieved. That is, sensor 328 can detect the proper endpoint for mixing the various components during formation of the buffered-HF/ammonium fluoride solutions. For example, sensor 328 can detect the endpoint for HF dilution with deionized water as well as during the step of bubbling ammonia vapor into the aqueous HF solution.

An acoustic velocity sensor 328 can be used for this purpose. Such equipment is commercially available from Mesa Labs. The application of acoustic sensors to chemical blending is described in detail in PCT Application No. PCT/US96/10389, filed on Jun. 5, 1996, the contents of which are herein incorporated by reference. In place of acoustic velocity measurement equipment, product concentration can be measured using, for example, conductivity, density, index of refraction, or infrared (IR) spectroscopy measurement equipment.

To further purify the chemical withdrawn from mixing tank 306, the chemical can optionally be passed through a filter 330. The filter is preferably constructed of Teflon®. However, the filter can be formed from other materials which do not contaminate the formed chemical. Filter 330 preferably has a pore size of, for example, from 0.05 to 0.1 $\mu$m.

Depending upon the concentration measurement by sensor 328 and the particular mixing step being monitored, the chemical can be withdrawn from the generation unit via line 332 as a final product by opening valve 334 and by closing valve 336. If the chemical is not of the proper final concentration, it can be reintroduced into mixing tank 306 via recycle line 338 by opening valve 336 and by closing valve 324.

The concentration measurement system can be connected to a valve control system which will automatically operate the valves to control material flow throughout the system. Those skilled in the art will readily be able to design and integrate appropriate controls in the inventive system by use of well known devices, circuits and/or processors and means for their control. Further discussion of this matter is omitted as it is deemed within the scope of persons of ordinary skill in the art.

Mixing tank 306 further includes a vent (exhaust) line 340 in an upper portion thereof for removing vapors from the tank. Vent line 340 can be connected to a downstream exhaust treatment apparatus, such as a gas scrubber. To prevent contamination of the chemicals in mixing tank 306 resulting from the backflow of contaminants through the vent line, a flow of an inert gas, such as nitrogen or argon, across the entrance to the vent line (i.e., an inert gas pad) can be used.

According to a method for preparing buffered-HF or ammonium fluoride according to a first aspect of the invention, ultra-high-purity anhydrous HF is introduced into mixing tank 306 and is diluted to the proper concentration with deionized water. Next, anhydrous ammonia can be added to the acid solution to an appropriate endpoint as determined by concentration analysis to obtain buffered-HF or ammonium fluoride.

The following example is provided to illustrate how 1 kg of 40% by weight ammonium fluoride solution can be generated according to one aspect of the invention. At first, the total respective amounts of HF and $NH_3$ to be dissolved in water are determined. 1 kg of 40% by weight ammonium fluoride ($NH_4F$) solution would contain 400 g of $NH_4F$ and 600 g of ultra pure water. Since the HF:$NH_3$ molar ratio is 1:1 for pure $NH_4F$, the 400 g of $NH_4F$ would include 216 g of anhydrous HF and 184 g of anhydrous $NH_3$ ($NH_4F$=37 g/mole; HF=20 g/mole; $NH_3$=17 g/mole)

At completion of the HF formation cycle, 216 g of anhydrous HF would be dissolved in 600 g of water, resulting in a 26.5% by weight HF solution. On-board instrumentation in the system controls the addition of HF to the water to achieve the proper HF concentration. As an alternative to starting with anhydrous HF, a 49% HF starting solution can be diluted to this concentration. After the 26.5% HF solution is formed, 189 g of $NH_3$ are added to mixing tank 306 via line 314 to form the 40% $NH_4F$ solution.

Other concentrations and molar ratios can be set by the concentration instrumentation for different applications simply by adjustment of the instrumentation. As a result, ammonium fluoride solutions and buffered-HF solutions of various concentrations can be generated.

According to a method for preparing buffered-HF or ammonium fluoride according to another aspect of the invention, premixed 49% HF or HF of any other concentration can be added to the mixing tank. The HF is then diluted with deionized water, if necessary, to the appropriate concentration endpoint as determined by the concentration sensor. Next, anhydrous ammonia can be added to an appropriate endpoint as determined by concentration analysis to obtain buffered-HF or ammonium fluoride.

According to the above-described methods, HF and high-purity water are mixed to the desired concentration, followed by the addition of ammonia to the requisite concentration to form buffered-HF or ammonium fluoride.

According to a further aspect of the invention, buffered-HF can be prepared by first forming an ammonium fluoride solution, for example, a 40% $NH_4F$ solution, according to the above procedures. This can then be followed by the addition of HF until hydrofluoric acid of the desired concentration is obtained. The concentrations during this final HF addition step can be controlled gravimetrically or by using any of the concentration control techniques described above.

The buffered-HF or $NH_4F$ generation system can be positioned in close proximity to the point of use of the ultrapure chemical in the production line, leaving only a short distance of travel between the purification unit and the production line. Alternatively, for plants with multiple points of use, the ultrapure chemical from the generation unit can pass through an intermediate holding tank before reaching the point(s) of use. Further, the mixing tank of the buffered-HF or $NH_4F$ generator system itself can be the point of use, in which the substrates are processed.

Each point of use can be fed by an individual outlet line from the holding tank. In either case, the ultrapure chemical can therefore be directly applied to the semiconductor substrate without packaging or transport and without storage other than a small in-line reservoir, and thus without contact with the potential sources of contamination normally encountered when chemicals are manufactured and prepared for use at locations external to the manufacturing facility.

In this class of embodiments, the distance between the point at which the ultrapure chemical leaves the purification system and its point of use on the production line will generally be a few meters or less. This distance will be greater when the purification system is a central plant-wide system for piping to two or more use stations, in which case the distance may be two thousand feet or greater. Transfer can be achieved through an ultra-clean transfer line of a material which does not introduce contamination. In most applications, stainless steel or polymers such as high density polyethylene or fluorinated polymers can be used successfully.

Due to the proximity of the purification unit to the production line, the water used in the unit can be purified in accordance with semiconductor manufacturing standards. These standards are commonly used in the semiconductor industry and are well known among those skilled in the art and experienced in the industry practices and standards.

Methods of purifying water in accordance with these standards include ion exchange and reverse osmosis. Ion exchange methods typically include most or all of the following units: chemical treatment such as chlorination to kill organisms; sand filtration for particle removal; activated charcoal filtration to remove chlorine and traces of organic matter; diatomaceous earth filtration; anion exchange to remove strongly ionized acids; mixed bed polishing, containing both cation and anion exchange resins to remove further ions; sterilization, involving chlorination or ultraviolet light; and filtration through a filter of 0.45 micron or less. Reverse osmosis methods will involve, in place of one or more of the units in the ion exchange process, the passage of the water under pressure through a selectively permeable membrane which does not pass many of the dissolved or suspended substances.

Typical standards for the purity of the water resulting from these processes are a resistivity of at least about 15 megohm-cm at 25° C. (typically 18 megohm-cm at 25° C.), less than about 25 ppb of electrolytes, a particulate content of less than about 150/$cm^3$ and a particle size of less than 0.2 micron, a microorganism content of less than about 10/$cm^3$, and total organic carbon of less than 100 ppb.

Wafer Cleaning

Figure 4:
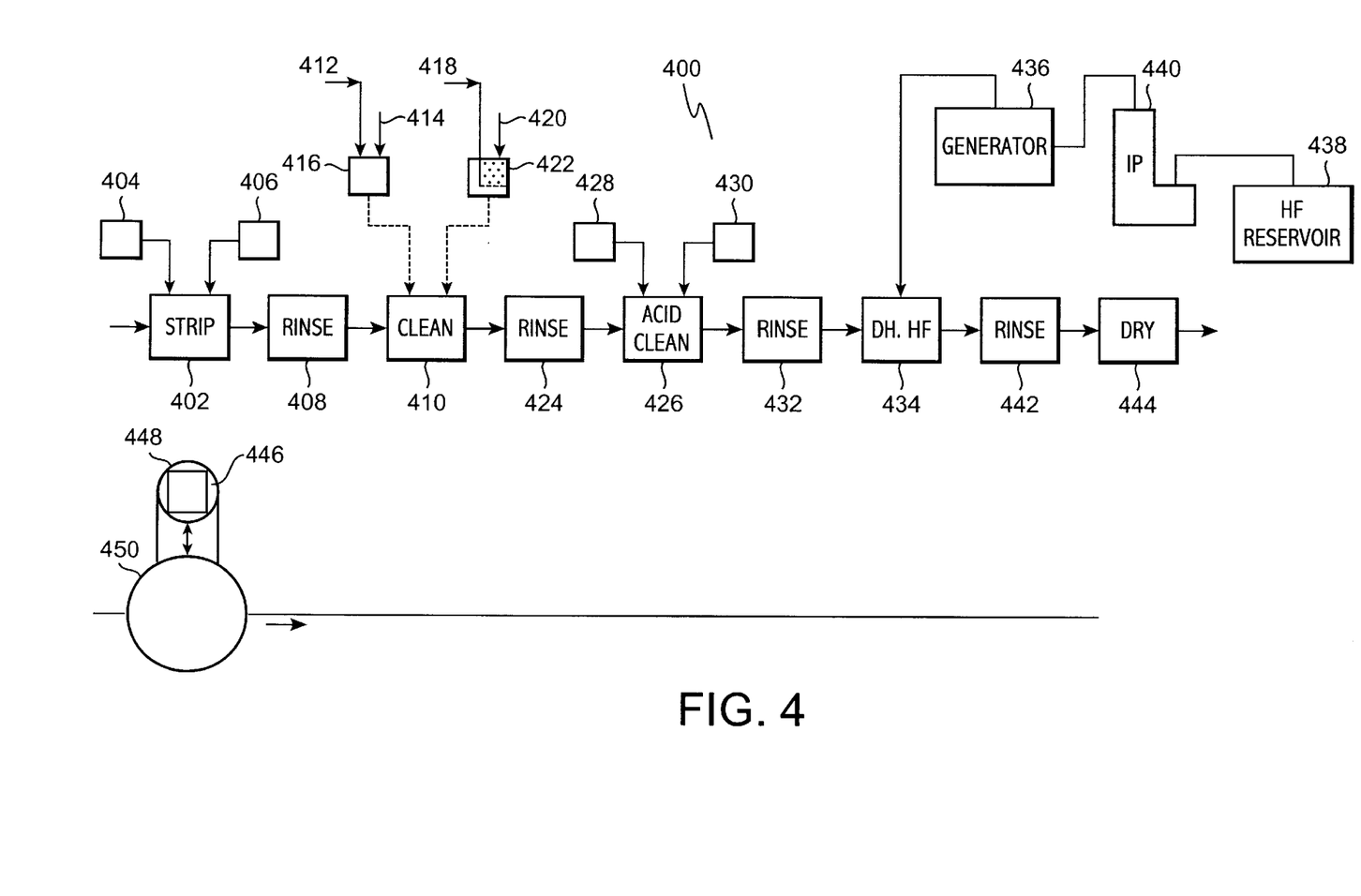
FIG. 4 is a block diagram of a semiconductor fabrication line to which the hydrofluoric acid generator of FIG. 2 can be connected.

FIG. 4 illustrates exemplary wafer cleanup stations in a conventional line 400 for semiconductor fabrication. The first unit in the cleaning line is a photoresist stripping station 402, in which aqueous hydrogen peroxide 404 and sulfuric acid 406 are combined and applied to the semiconductor surface to strip off the resist. This is followed by a rinse station 408, where deionized water is applied to rinse off the stripping solution.

Immediately downstream of rinse station 408 is a cleaning station 410 into which an aqueous solution of ammonia and hydrogen peroxide are applied. This solution is supplied in one of two ways. In the first, aqueous ammonia 412 is combined with aqueous hydrogen peroxide 414, and the resulting mixture 416 is directed to cleaning station 410.

According to the second method, pure gaseous ammonia 418 is bubbled into an aqueous hydrogen peroxide solution 420 to produce a similar mixture 422, which is likewise directed to cleaning station 410. Once cleaned with the ammonia/hydrogen peroxide combination, the semiconductor passes to second rinse station 424 where deionized water is applied to remove the cleaning solution.

The next station is a further cleaning station 426 where aqueous solutions of hydrochloric acid 428 and hydrogen peroxide 430 are combined and applied to the semiconductor surface for further cleaning. This is followed by a final rinse station 432 where deionized water is applied to remove the HCl and $H_2O_2$.

At deglaze station 434, dilute aqueous HF or dilute buffered-HF is applied to the wafer, for example, to remove a native or other oxide film. The dilute buffered-hydrofluoric acid can be supplied using a system as described above. For example, the buffered-HF can be supplied directly, through sealed piping, from generator 436. HF reservoir 438 holds anhydrous HF, from which a stream of gaseous HF is fed through ionic purifier 440 into the generator. To provide a buffered solution, gaseous ammonia can be bubbled into generator 436 and ultrapure deionized water can be added to achieve the desired dilution. This is followed by a rinse in ultrapure deionized water at station 442, and drying at station 444.

The wafer or wafer batch 446 being treated is held on a wafer support 448 and is conveyed from one workstation to the next by a robot 450 or some other conventional means of achieving sequential treatment. The means of conveyance can be totally automated, partially automated or not automated at all.

The system shown in FIG. 4 is just one example of a cleaning line which can be used in the manufacture of semiconductor devices. In general, cleaning lines for high-precision manufacture can vary widely from that shown in FIG. 4, either by eliminating one or more of the units shown or by adding or substituting one or more units not shown. The concept of the on-site preparation of high-purity buffered-HF and ammonium fluoride, however, in accordance with this invention is applicable to all such systems.

Modifications and Variations

While the invention has been described in detail with reference to specific embodiments thereof, it will be apparent to those skilled in the art that various changes and modifications can be made, and equivalents employed, without departing from the scope of the appended claims. For example, the disclosed innovative techniques can be applied to the manufacture of products other than ICs, such as discrete semiconductor components (e.g., optoelectronic and power devices), and to other manufacturing technologies in which IC manufacturing methods have been adopted (e.g., the manufacture of thin-film magnetic heads and active-matrix liquid-crystal displays).

Furthermore, filtration units or stages in addition to those described above can be combined with the disclosed purification apparatus.

It should also be noted that additives can be introduced into the purification water if desired, although this is not done in the presently preferred embodiment.

According to a further aspect of the invention, the disclosed methods and systems can be adapted to operate as part of a manufacturing unit to produce ultra-high-purity chemicals for packaging and/or shipment. In this case, however, the advantages associated with the generation and purification of the chemicals on-site would not be realized. While such applications are subject to the above-discussed problems associated with the handling of ultra-high-purity chemicals, the disclosed innovations nevertheless provide an initial purity which is higher than that available by other techniques.

Furthermore, although the primary embodiment is directed to providing ultrapure aqueous chemicals which are most critical for semiconductor manufacturing, the disclosed system and method embodiments can also be used to supply purified gas streams. In many cases, use of a dryer downstream from the purifier can be used for this purpose.

It should also be noted that piping for ultrapure chemical routing in semiconductor front ends may include in-line or pressure reservoirs. Thus references to "direct" piping does not preclude the use of such reservoirs, but does preclude exposure to uncontrolled atmospheres.

What is claimed is:

1. A method of preparing buffered-hydrofluoric acid or ammonium fluoride, suitable for use in fabricating semiconductor devices, comprising contacting high-purity water and hydrofluoric acid, thereby forming a diluted hydrofluoric acid and bubbling purified ammonia vapor into the diluted hydrofluoric acid, wherein the concentration of the buffered-hydrofluoric acid or ammonium fluoride is controlled by a step for detecting an endpoint of the bubbling, wherein the step of contacting the high-purity water and the hydrofluoric acid and the step of bubbling purified ammonia vapor into the diluted hydrofluoric acid occur in the same vessel, and wherein the hydrofluoric acid is prepared by a process comprising the steps of:

removing a flow of hydrogen fluoride vapor from a source of hydrogen fluoride;

contacting said hydrogen fluoride vapor with a recirculating volume of high-purity water containing a high concentration of hydrogen fluoride in a hydrogen fluoride ionic purifier unit, wherein said hydrogen fluoride ionic purifier unit passes purified hydrogen fluoride gas; and combining the hydrogen fluoride gas with acidic deionized water to produce the hydrofluoric acid.

2. The method according to claim 1, wherein the source of hydrogen fluoride is an anhydrous hydrogen fluoride source.

3. The method according to claim 1, wherein the source of hydrogen fluoride is essentially arsenic-free.

4. The method according to claim 1, wherein the source of hydrogen fluoride is high purity arsenic-free aqueous hydrogen fluoride.

5. The method according to claim 1 wherein the ammonia vapor is prepared by a process comprising the steps of:

removing a flow of ammonia vapor from a source of liquid ammonia;

contacting said flow of ammonia vapor with a recirculating volume of high-purity water containing a high concentration of ammonium hydroxide in an ammonia ionic purifier unit.

6. The method according to claim 5, wherein said recirculating volume of high-purity water in said hydrogen fluoride ionic purifier and said recirculating volume of high-purity water in said ammonia ionic purifier are free of additives.

7. The method according to claim 1, wherein the step for detecting the endpoint of the bubbling step is performed by acoustic velocity measurement.

8. The method according to claim 1, wherein the ammonia bubbling is performed in a generator which is connected to a point of use in which substrates are processed.

9. A method of preparing buffered-hydrofluoric acid or ammonium fluoride, suitable for use in fabricating semiconductor devices, comprising introducing high-purity water into hydrofluoric acid until a first predetermined endpoint is detected, thereby forming a diluted hydrofluoric acid, wherein the first predetermined endpoint is detected by monitoring the concentration of the diluted hydrofluoric acid; and bubbling purified ammonia vapor into the diluted hydrofluoric acid until a second predetermined endpoint is detected, wherein the second predetermined endpoint is detected by monitoring the concentration of the resulting solution, wherein the step of introducing the high-purity water into the hydrofluoric acid and the step of bubbling purified ammonia vapor into the diluted hydrofluoric acid occur in the same vessel.

10. The method according to claim 9, wherein buffered-hydrofluoric acid is prepared.

11. The method according to claim 10, wherein said buffered-hydrofluoric acid has a concentration of 10:1, 50:1 or 200:1 as measured by volume parts of 40% ammonium fluoride to 49% HF.

12. The method according to claim 9, wherein ammonium fluoride is prepared.

13. The method according to claim 12, wherein the ammonium fluoride is a 40% by weight ammonium fluoride solution.

14. The method according to claim 1, wherein the ammonia vapor bubbling is performed in a generator which is connected to a point of use.

15. The method according to claim 4, wherein the point of use is located in a semiconductor device fabrication facility.

16. The method according to claim 14, wherein a portion of the resulting solution is continuously removed from the generator, said portion being reintroduced into the generator until the second predetermined endpoint is detected.

17. The method according to claim 16, wherein the portion of the resulting solution is passed through a heat exchanger to remove the heat of reaction therefrom.

18. The method according to claim 14, wherein the hydrofluoric acid is 49% by weight hydrogen fluoride.

19. The method according to claim 9, wherein additional hydrofluoric acid is added to the solution after the ammonia bubbling step, thereby forming said buffered-hydrofluoric acid.

20. The method according to claim 9, wherein the ammonia bubbling step forms a 40% ammonium fluoride solution product.

21. The method according to claim 9, wherein the concentration monitoring for the diluted hydrofluoric acid and the resulting solution is performed by acoustic velocity measurement.

22. The method according to claim 9, wherein the hydrofluoric acid is formed by introducing anhydrous hydrogen fluoride into high-purity water in a generator.

23. A method of preparing buffered-hydrofluoric acid or ammonium fluoride, suitable for use in fabricating semiconductor devices, comprising contacting high-purity water and hydrofluoric acid, thereby forming a diluted hydrofluoric acid and bubbling purified ammonia vapor into the diluted hydrofluoric acid, wherein the concentration of the buffered-hydrofluoric acid or ammonium fluoride is controlled by a step for detecting an endpoint of the bubbling, wherein the step of contacting the high-purity water and the hydrofluoric acid and the step of bubbling purified ammonia vapor into the diluted hydrofluoric acid occur in the same vessel, and wherein the ammonia vapor is prepared by a process comprising the steps of:

removing a flow of ammonia vapor from a source of liquid ammonia;

contacting said flow of ammonia vapor with a recirculating volume of high-purity water containing a high concentration of ammonium hydroxide in an ammonia ionic purifier unit, wherein said ammonia ionic purifier unit passes said purified ammonia vapor.

24. The method according to claim 23, wherein the ammonia bubbling is performed in a generator which is connected to a point of use in which substrates are processed.

25. A method of preparing buffered-hydrofluoric acid or ammonium fluoride, suitable for use in fabricating semiconductor devices, comprising contacting high-purity water and hydrofluoric acid, thereby forming a diluted hydrofluoric acid, and bubbling purified ammonia vapor into the diluted hydrofluoric acid in a vessel in which substrates are also processed, wherein the step of contacting the high-purity water and the hydrofluoric acid and the step of bubbling purified ammonia vapor into the diluted hydrofluoric acid occur in the vessel.

* * * * *

UNITED STATES PATENT AND TRADEMARK OFFICE
CERTIFICATE OF CORRECTION

PATENT NO.      : 6,350,425 B2  Page 1 of 1
APPLICATION NO. : 08/881747
DATED           : February 26, 2002
INVENTOR(S)     : Joe Hoffman et al.

It is certified that error appears in the above-identified patent and that said Letters Patent is hereby corrected as shown below:

Col. 15 in Claim 14, Line 23, please delete the number "1" and please replace it with the number -- 9 --.

Col. 15 in Claim 15, Line 26, please delete the number "4" and please replace it with the number -- 14 --.

Signed and Sealed this

Twenty-sixth Day of February, 2008

JON W. DUDAS
*Director of the United States Patent and Trademark Office*